United States Patent [19]

Iwano et al.

[11] Patent Number: 4,856,013

[45] Date of Patent: Aug. 8, 1989

[54] SEMICONDUCTOR LASER HAVING AN ACTIVE LAYER AND CLADDING LAYER

[75] Inventors: Hideaki Iwano; Yoshifumi Tsunekawa, both of Suwa, Japan

[73] Assignee: Seiko Epson Corporation, Tokyo, Japan

[21] Appl. No.: 113,788

[22] Filed: Oct. 28, 1987

[30] Foreign Application Priority Data

| | | | |
|---|---|---|---|
| Oct. 29, 1986 | [JP] | Japan | 61-257539 |
| Oct. 29, 1986 | [JP] | Japan | 61-257540 |
| Nov. 14, 1986 | [JP] | Japan | 61-271404 |
| Dec. 5, 1986 | [JP] | Japan | 61-290263 |
| Dec. 5, 1986 | [JP] | Japan | 61-290264 |
| Dec. 11, 1986 | [JP] | Japan | 61-295197 |
| Feb. 12, 1987 | [JP] | Japan | 62-30134 |
| Jul. 7, 1987 | [JP] | Japan | 62-169458 |
| Aug. 19, 1987 | [JP] | Japan | 62-205602 |

[51] Int. Cl.$^4$ .............................. H01S 3/19
[52] U.S. Cl. .......................... 372/45; 372/46
[58] Field of Search ........................ 372/45, 46

[56] References Cited

U.S. PATENT DOCUMENTS

| | | | |
|---|---|---|---|
| 4,121,179 | 10/1978 | Chinone et al. | 372/46 |
| 4,607,369 | 8/1986 | Niina et al. | 372/46 |
| 4,608,695 | 8/1986 | Oda et al. | 372/46 |
| 4,615,032 | 9/1986 | Holbrook et al. | 372/45 |
| 4,679,200 | 7/1987 | Matsui et al. | 372/45 |
| 4,740,976 | 4/1988 | Kajimura et al. | 372/45 |

FOREIGN PATENT DOCUMENTS

| | | | |
|---|---|---|---|
| 0035487 | 4/1981 | Japan | 372/46 |
| 0196087 | 11/1983 | Japan | 372/45 |

OTHER PUBLICATIONS

Hanamitsu et al; "Transient Spectra . . . Double-Heterostructure Lasers"; J. Appl. Phys. 51 (12); Dec. 1980; pp. 6415-6417.

*Primary Examiner*—William L. Sikes
*Assistant Examiner*—Xuan T. Vo
*Attorney, Agent, or Firm*—Blum Kaplan

[57] ABSTRACT

A laser has an active layer formed on a prepared substrate, a cladding layer on the active layer and a contact layer on the cladding layer. The active layer and contact layer are formed of a semiconductor material of elements from Groups III-V. The contact layer and cladding layer are formed into an elongated projecting rib wherein the cladding layer has a remaining planar portion disposed across the active layer. An insulating layer of semiconductor of elements from Group II-VI is formed on each side of the rib supported on the remaining cladding layer.

26 Claims, 9 Drawing Sheets

SEMICONDUCTOR LASER HAVING AN ACTIVE LAYER AND CLADDING LAYER

BACKGROUND OF THE INVENTION

This invention relates to semiconductor lasers, and in particular to semiconductor lasers constructed with an active layer and at least one cladding layer.

Semiconductor lasers are known in the art, however they suffer from current leakage. In the prior art devices current leakage is reduced by forming an injection blocking layer to provide a low threshold oscillation and high external quantum efficiency. An index guided structure is used to obtain stable transverse mode oscillation.

Figure 16:
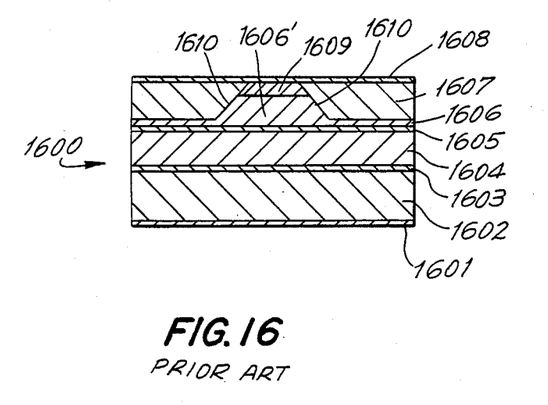
FIG. 16 is a cross sectional view of a prior art semiconductor laser.

One prior art semiconductor laser 1600, having a double heterostructure, is depicted in FIG. 16 and disclosed in *Electronic Letters*, Vol. 21 (1985), at page 903. Viewed from a lower electrode 1601 at the bottom to top includes an N-type GaAs substrate 1602, an N-type GaAs buffer layer 1603, an N-type $Al_{0.6}Ga_{0.4}As$ first cladding layer 1604, an undoped GaAs active layer 1605 and a P-type $Al_{0.6}Ga_{0.4}As$ second cladding layer 1606. A rib or projecting region 1606' having inclined side faces 1610 is etched in second cladding layer 1606. A P-type GaAs contact layer 1609 is formed on the flat peak of rib 1606'. An N-type GaAs layer covers the side faces 1610 of rib 1606' which blocks injection current by forming a reverse-bias P-N junction between GaAs layer 1607 and second cladding layer 1606. Thus, the wave guide can be achieved by the imaginary part of the refractive index due to the light absorbtion of N-type GaAs layer 1607. An upper electrode 1608 is disposed across the upper surface of N-type GaAs layer 1607 and GaAs contact layer 1609.

Figure 14:
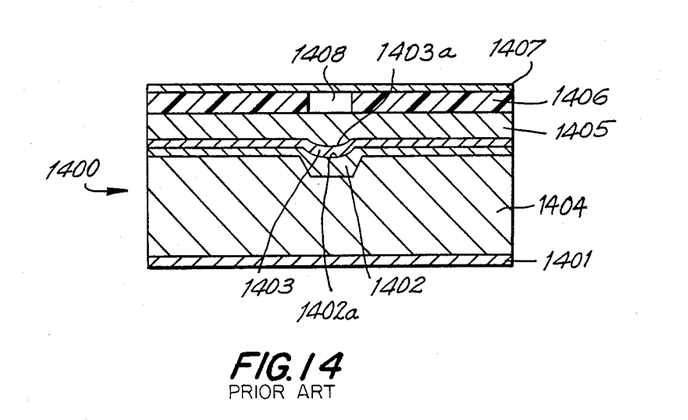
FIG. 14 is a top plan view of a prior art semiconductor laser.

A second prior art semiconductor laser 1400, again having a double heterostructure, is shown in cross-section in FIG. 14 and disclosed in IEEE, *Journal of Quantum Electronics*, Vol. QE-19 (1983), at page 1021. Laser 1400 has a layered structure of an N-type $Al_{0.16}Ga_{0.84}As$ active layer 1403 which includes a curved portion which extends into a groove 1402a of an N-type $Ga_{0.5}Al_{0.5}As$ cladding layer and a GaAs substrate 1404 so that the real index-guiding is realized by the difference between the refractive index of curved portion of As active layer 1403 and that outside. A semi-insulating ZnSe layer 1406 which blocks injection current is disposed on a P-type $Ga_{0.5}Al_{0.5}As$ cladding layer 1405 disposed on active layer 1403. ZnSe layer 1406 is formed with a P-type GaAs contact layer 1408 in the region of semi-insulating layer 1406 opposite curved portion 1403a. Finally, an N-type electrode 1401 is disposed on substrate 1404 and a P-type electrode 1407 is on semi-insulating layer 1406.

Figure 15A:
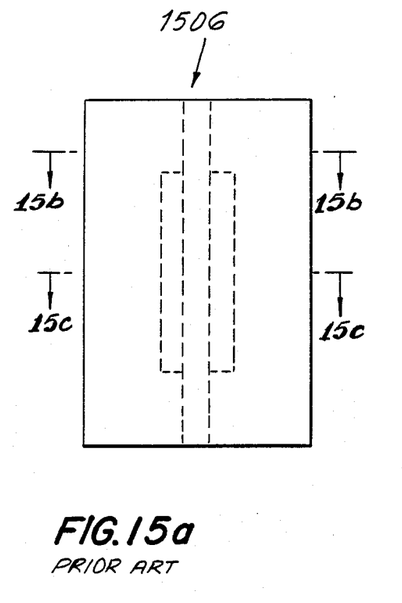
FIG. 15a is a top plan view of a prior art semiconductor laser.
Figure 15B:
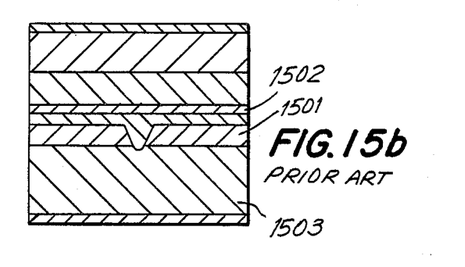
Figure 15C:
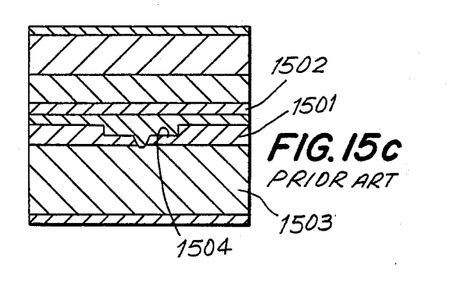

When a semiconductor laser is utilized as a light source in an optical information processing apparatus, noise is generated when a part of the emiting light is returned to the cavity (hereinafter referred to as feed back induced noise), making the apparatus impractical to use. In an effort to reduce this feed back induced noise two other prior art devices, Japanese Patent Laid Open Nos. 140774/85 and 150682/85 disclose an index-guided structure at the end face of the cavity and a gain-guided structure in the center of the cavity to obtain multiple longitudinal mode oscillation. FIG. 15a is a top plan view of a laser 1506 including this structure, FIG. 15b is a cross sectional view taken along lines b—b and FIG. 15c is a sectional view taken along lines c—c.

An N-type GaAs injection blocking layer 1501 is formed with a V-shaped stripe groove and layered onto a P-type GaAs substrate 1503. A wide groove 1504 is formed by etching the center of the cavity so that the wave guide forms a gain guided structure only at the center of the device. As a result the multiple longitudinal mode is obtained and the feed back induced noise can be reduced.

All of these prior art devices have proved satisfactory, however, if the injection current is blocked utilizing the reverse bias P-N junction between the N-type GaAs layer and second cladding layer 1607 as shown in FIG. 16, a junction plane is formed near active layer 1605. Furthermore, if the carrier concentration is high, breakdown voltage is low, resulting in current leakage near active layer 1605, the rise of the threshold current and the breakdown of the wall surface of rib 1610 in the high output power condition. Thus, the reliability of the apparatus decreases. Furthermore, the wave is guided by the light absorption so that the guide wave is lost and the threshold current is increased. Light absorption occurs on the side face of the wave guide, the phase of the guided wave is delayed and the wave is curved at the end face of the output side, resulting in a large astigmatism.

In the case of semiconductor laser 1400 of FIG. 14, the leakage current of the carrier which diffuses second cladding layer 1405 cannot be limited causing an increase in a threshold current, deterioration of the external quantum efficiency and an increase of the driving current resulting in deterioration of reliability.

The structure of laser 1506 in FIG. 15b is utilized for reducing the feed back induced noise. As active layer 1502 is grown on grooves of different widths, due to the differences in growing speed, the thickness of active layer 1502 in the index-guided structure is different from that in the gain-guided structure. As a result an increase of the threshold current and decrease of external quantum efficiency are caused by the loss of wave guide in the boundaries. Furthermore, the length of the gain-guided wave guide can no longer be optionally set and due to this value, the longitudinal mode becomes a single mode causing a large amount of noise against the optical feedback.

Accordingly, it is desirable to provide a semiconductor laser which overcomes the shortcomings of the prior art described above.

SUMMARY OF THE INVENTION

Generally speaking, in accordance with the invention, a semiconductor laser formed on a semiconductor substrate including a contact layer on a cladding layer formed of compound semiconductors of elements from Groups III-V which are etched to form a rib having an inverted trapezoidal cross-section with a current confinement layer grown in the removed regions and across the rib is provided. A strip of the confinement layer over the remaining contact layer is removed and an electrode layer is formed on both surfaces of the substrate. The confinement layer is formed from semiconductor compounds from elements of Groups II-VI.

In one embodiment the group II-VI semiconductor is formed by a metal organic chemical vapor deposition (hereinafter referred to as the MOCVD) using zinc-organic compounds which are adducts of dialkylzinc and dialkylselenium, as the zinc source. The rib width just above the active layer is from 0.5 to 10.0 μm and the rib thickness of the cladding layer just above the active layer between the active layer and insulating layer is 0 to 2.0 μm. The angle formed between the side face of the rib and the junction plane of the double heterostructure ranges from 50° to 120°.

The rib is set so that a wave guide due to the group II-VI semiconductor acts as an index-guided structure near an end face of the cavity, and is set wide enough to act as a gain-guided structure in the center of the cavity. The striped electrode which controls the current flow path is provided in the upper portion of the wave guide. The length of the region having the index-guided structure is from 10 to 500 μm from the light output side, the length of the gain-guided region is from 10 to 500 μm, the width of the index guided region is from about 1 to 10 μm, the width of the gain-guided structure is at least 5 μm and the width of the stripe which controls the current flow path is from about 1 to 10 μm.

In another embodiment, the rib width of the index-guide region is from about 0.5 to 10 μm and the thickness of the cladding layer just above the active layer, and between the active layer and the resistance layer is from about 0-2.0 μm. The angle between the side face of the rib in the index guided region and the junction plane of the double heterostructure is from 50° to 120°. The relation between the length of the region having the index-guided structure (hereinafter referred to as l1 and l3) and that of the region having the gain-guided structure (hereinafter referred to as l2) is represented by the following equations:

$$l1 \neq l2, l2 \neq l3$$

$$0.3 \leq l2/(l1+l3) \leq 10$$

Accordingly, it is an object of this invention to provide an improved semiconductor laser.

Another object of the invention is to provide a semiconductor laser wherein leakage of induced current to the outside of the oscillation region is entirely cut-off.

A further object of the invention is to provide a semiconductor laser wherein only the fundamental transverse mode oscillation can be controlled by the effect for available optical confinement.

Yet another object of the invention is to provide a semiconductor laser wherein the threshold current is low, and the stable single transverse mode oscillation is obtainable during high output power operation.

Still another object of the invention is to provide a semiconductor laser wherein the feedback-induced noise can be greatly reduced.

Still other objects and advantages of the invention will in part be obvious and will in part be apparent from the specification and drawings.

The invention accordingly comprises the features of construction, combination of elements, and arrangement of parts which will be exemplified in the construction hereinafter set forth and the several steps and the relation of one or more of such steps with respect to each of the others thereof, which will be exemplified in the method hereinafter disclosed, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 4i a–4f are sectional views illustrating the steps in the manufacturing of the semiconductor laser of FIG. 3;

FIGS. 9b and 9c are cross-sectional view taken along the lines 9b—9b and lines 9c—9c of FIG. 9a;

FIGS. 15b and 15c are cross sectional views taken along the lines 15b—15b and 15c—15c of FIG. 15a.

DESCRIPTION OF THE PREFERRED EMBODIMENTS

Figure 1:
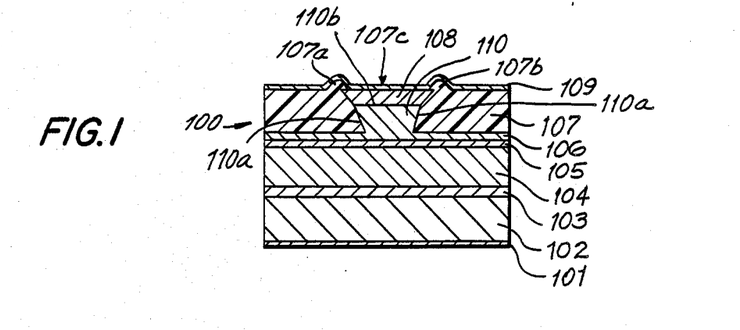
FIG. 1 is a cross-sectional view of of a semiconductor laser constructed in accordance with the invention.

Reference is made to FIG. 1 wherein a cross-sectional view of a semiconductor laser generally indicated as 100, constructed in accordance with preferred embodiment of the invention is shown. Semiconductor laser 100 is formed by disposing an N-type GaAs buffer layer 103 on a surface of an N-type GaAs single crystal substrate 102. A first or lower N-type AlGaAs cladding layer 104 is formed on buffer layer 103 and a GaAs or AlGaAs active layer 105 is formed thereon. A P-type AlGaAs cladding layer 106 is formed on active layer 105 and a P-type GaAs contact layer 108 is formed on cladding layer 106.

P-type AlGaAs cladding layer 106 and contact layer 108 are etched to form a reversed mesa shaped rib 110 having an inverted trapezoidal cross-section. Rib 110 is formed with side edges 110a which incline inwardly from a top surface 110b to the remaining planar portion of upper cladding layer 106. A Group II–VI semi-conductor layer 107, such as ZnSe is formed in the removed portion of cladding layer 106 and across the top of remaining contact layer 108. This forms projecting regions 107a and 107b along the sides of contact layer 108. A P-type electrode 109 for ohmic contact is provided across the upper surface of laser 100 and an N-type electrode 101 is provided on the opposed surface of substrate 102.

A carrier injection is produced in active layer 105 by a forward current flow between upper electrode 109 and lower electrode 101. Radiative recombination is amplified between both ends of the cavity in laser 100 so that a laser light is emitted. In this embodiment ZnSe layer 107 has a resistivity of $10^7$ $\Omega$cm or higher preventing the injection current from flowing outside of rib 110. Thus, laser oscillation occurs only in active layer 105 just under rib 110 so that current leakage does not occur. This results in a reduction of the necessary threshold current.

If the growth of covering heretrostructure for side faces 110a of rib 110 is an AlGaAs semiconductor layer, the crystallographic plane parallel to the junction of cladding layer 106 differs from that of side face 110a of rib 110. This produces interface states near side face 110a. Deterioration of emission accelerates due to the leakage current flowing in the interface. However, when growth is accomplished utilizing the MOCVD method using a group II–VI semiconductor, such as ZnSe the selectivity for the crystallographic plane is small. Thus, an interface is not formed after the growth of the covering heterostructure on rib side face 110a. Furthermore, AlGaAs has almost the same lattice constant as ZnSe so that a dislocation due to a mismatching in the interface between AlGaAs and ZnSe does not occur. A loss of the injection carrier and the guided light does not occur, thereby further reducing the necessary threshold current and improving the external quantum efficiency.

Additionally, the refractive index of ZnSe is 2.53 which is lower than that of GaAs which is 3.4. The real refractive index difference occurs in the oscillation region and in a certain region of covering ZnSe layer 107 so that the guided wave can be efficiently confined in the oscillation region, thereby reducing the threshold current and improving the external quantum efficiency. Due to the index-guided structure, light absorption does not occur at rib side face 110a so that a wave front of the output laser wave is not curved at the output end face. Accordingly, an oscillation with a small astigmatism can be achieved.

Figure 2:
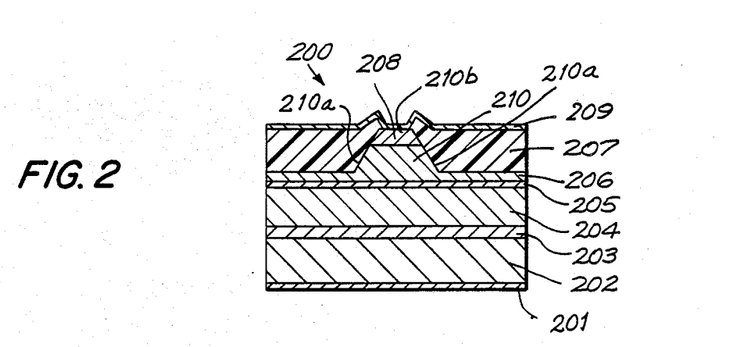
FIG. 2 is a cross-sectional view of another embodiment of a semiconductor laser constructed in accordance with the invention.

FIG. 2 illustrates another laser, generally indicated as 200, formed in accordance with the invention. Laser 200 is formed by disposing an N-type GaAs buffer layer 203, an N-type AlGaAs cladding layer 204, and a GaAs or AlGaAs active layer 205 on an N-type GaAs single crystal substrate 202. In this embodiment, a P-type AlGaAs cladding layer 206 is formed as a mesa shaped rib 210 having outwardly sloping side surfaces 210a and an upper rib surface 210b with a P-type GaAs contact layer 208 on upper surface 210b. A group II–VI semiconductor resistance layer 207, of ZnSe is deposited on cladding layer 206 and abuts both sides 210a of rib 210. ZnSe layer 207 is etched into the upper surface of contact layer 208, and a P-type electrode 209 for ohmic contact is formed thereon and an N-type electrode 201 is formed on the opposite surface of substrate 202. For reasons similar to those discussed above in the first embodiment, a semiconductor laser with a low threshold current and a high reliability is also provided by this embodiment.

Figure 4A:
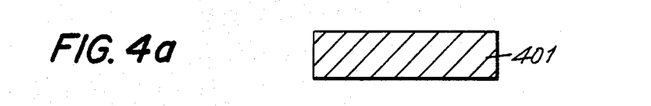
Figure 4B:
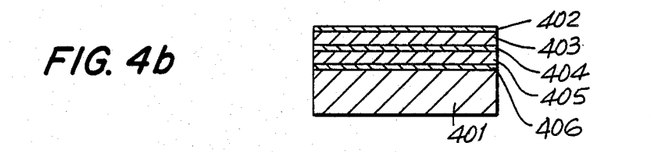

Reference is made to FIGS. 4a–4f which illustrate the steps in a process for manufacturing a semiconductor laser in accordance with the invention. An N-type GaAs buffer layer 406 is deposited on substrate 401, and an N-type AlGaAs cladding layer 405 is formed thereon. A GaAs or AlGaAs active layer 404 is formed on cladding layer 405 and a P-type AlGaAs cladding layer 403 is formed on active layer 404. A P-type GaAs contact layer 402 is disposed on P-type cladding layer 403 as shown in FIG. 4b. The layers are grown by utilizing the MOCVD method. The AlGaAs layer may be formed using gallium organics, aluminum organics and hydrogen arsenide for the source materials.

Figure 4C:
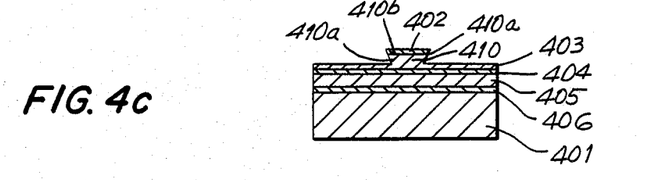
Figure 4D:
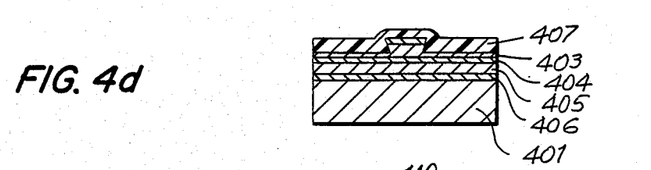
Figure 4E:
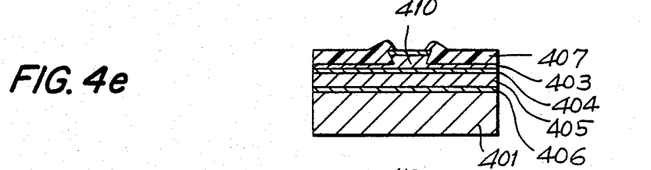
Figure 4F:
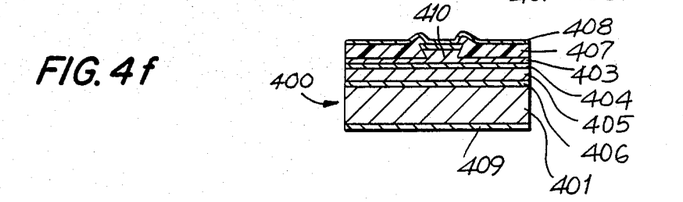

Contact layer 402 and cladding layer 403 are etched by a standard photolithographic procedure to form a striped rib 410 having an inverted trapazoidal rib 410 including remaining portion of contact layer 402 and a projecting portion of cladding layer 403 with inwardly inclined side faces 410a and upper surface 410b. A buried ZnSe layer 407 is grown on the remaining planar portion of cladding layer 403 and contact layer 402 and abutting the inclined side faces of rib 410 by MOCVD (FIG. 4d). The portion of ZnSe layer 407 on top surface rib 410b is etched by photolithography (FIG. 4e) to provide access to contact layer 402. A P-type electrode 408 for ohmic contact is formed across the top surface of laser 400 and N-type electrode 409 for ohmic contact is formed on the lower surface of substrate 401 of laser 400 (FIG. 4f).

Figure 5:
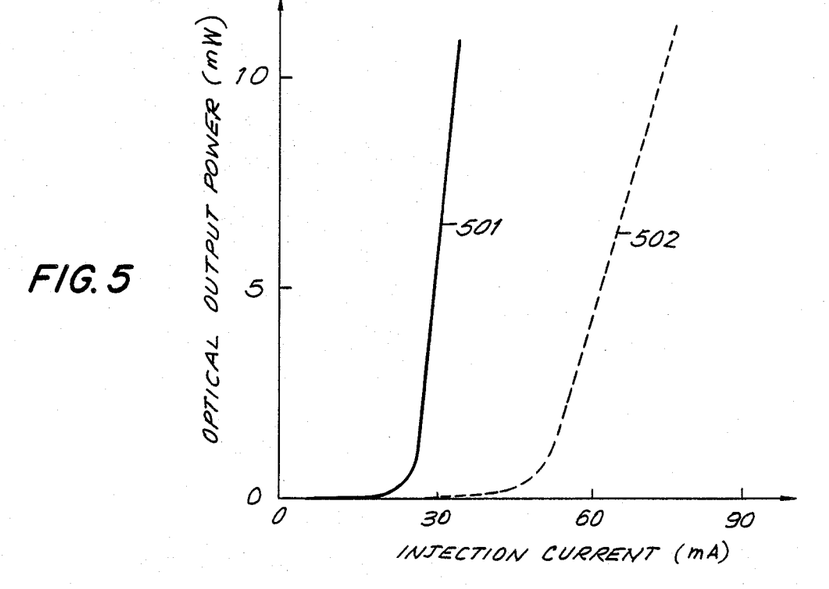
FIG. 5 is a graph comparing the relationship between optical output power and injection current of a prior art laser and a laser constructed in accordance with the invention.

FIG. 5 illustrates by a curve 501 the relationship between optical output power and injection current of semiconductor laser 100 of FIG. 1. A curve 502 shows the results for a prior art semiconductor laser utilizing a group III–V semiconductor layer to cover the cladding layer. As the resistivity of the group II–VI semiconductor compounds become larger less current leakage occurs outside of the oscillation region so that the threshold current may be reduced and the quantum efficiency may be improved by efficiently utilizing the index guided structure.

Figure 6:
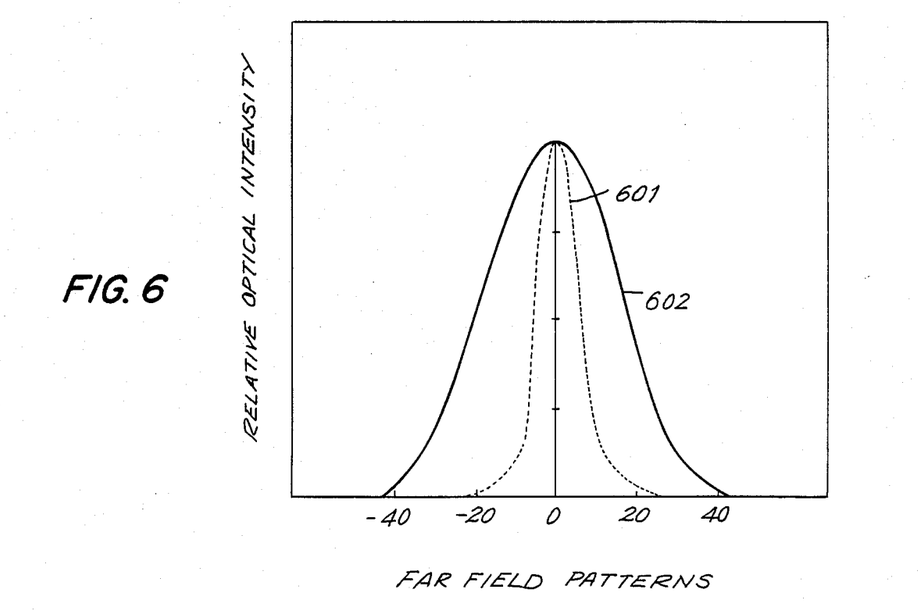
FIG. 6 is a graph showing the far field pattern for a semiconductor laser constructed in accordance with the invention.

Referring to FIG. 6, the far-field patterns of semiconductor laser 100 are shown. A curved 601 represents the relative optical intensity in the direction parallel to the junction plane and a curve 602 represents the relative optical intensity in the direction perpendicular to the junction plane. Both curves show a fundamental transverse mode oscillation which can be obtained at an output power of 20 mw. Furthermore, the longitudinal mode for semiconductor laser 100 is single and the astigmatism is low, having a value of 3 $\mu$m or lower.

Figure 7:
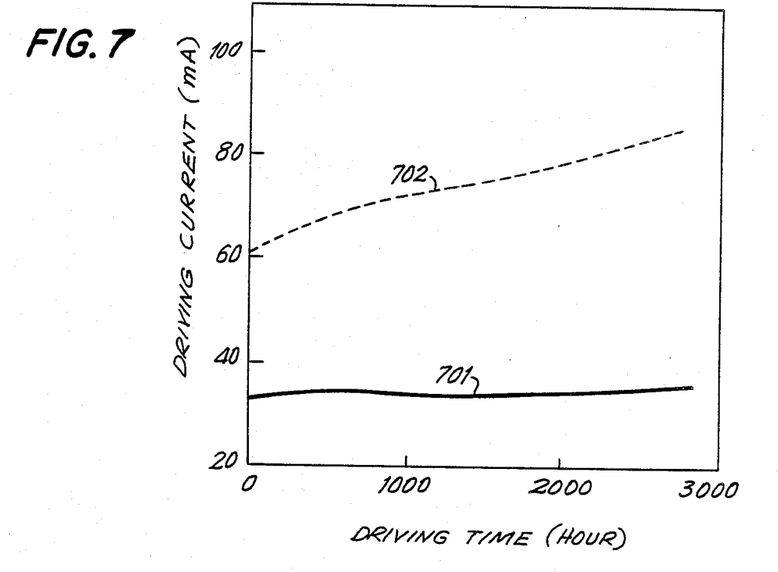
FIG. 7 is a graph comparing the relationship between driving current and driving time of the prior art laser and a laser constructed in accordance with the invention.

FIG. 7 demonstrates the life span of semiconductor laser 100. The optical output power and the enviornmental temperature are fixed at 5 mW and 50° C. respectively. A curve 701 shows the required change in the driving current input for achieving a 5 mW output of semiconductor laser 100. A curve 702 shows the change in input of driving current necessary for achieving a 5 mW output in a conventional semiconductor laser wherein a group III–V semiconductor such as GaAs is used as the cover layer. In this case, the required driving current for the prior art laser increases over time and the deterioration rate is high; while semiconductor laser 100 remains at a substantially constant level for about 3,000 hours of use.

Figure 8:
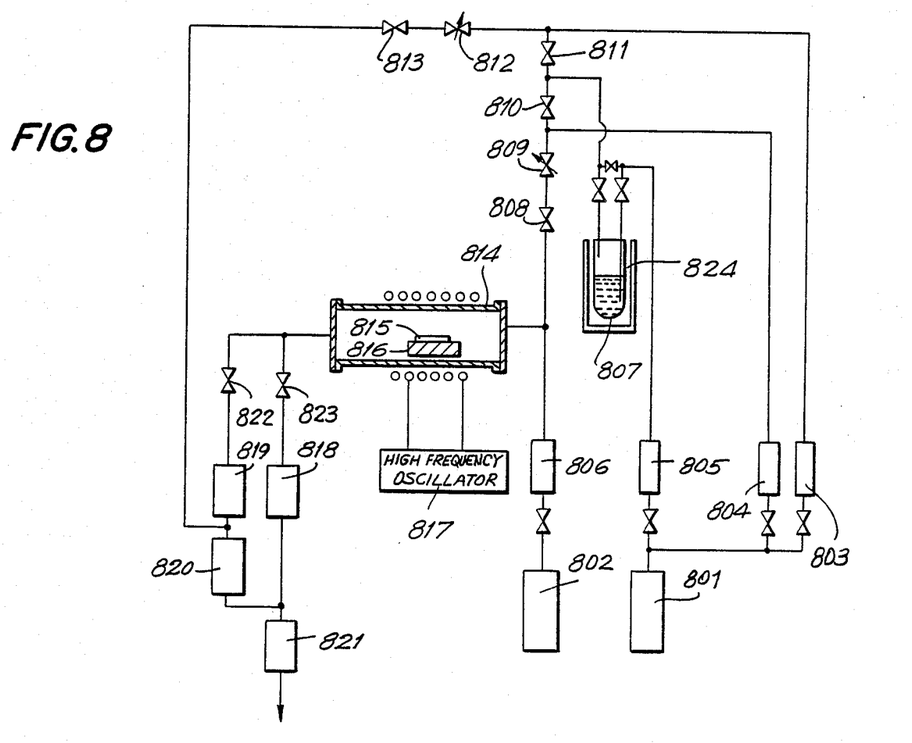
FIG. 8 is a schematic view of an MOCVD apparatus for growing the semiconductor layers on the lasers fabricated in accordance with the invention.

FIG. 8 illustrates the principal constituents of the MOCVD apparatus to grow the ZnSe layer. This layer covers rib 410 and remaining AlGaAs cladding layer as shown in FIG. 4d. A substrate 815 formed with a rib such as rib 410 in FIG. 4c is disposed on a graphite susceptor 816 and placed in a reactor 814. Substrate 815 is heated inductively by a high frequency oscillator 817. After drawing a vacuum in reactor 814 by a turbomolecular pump 819 and a rotary pump 820, a material gas is introduced while the pressure is kept at a fixed value by a rotary pump 818 and a processing system 812 for processing exhaust gas.

The zinc source adduct is encapsulated in a bubler 807. A carrier gas and hydrogen selenide ($H_2Se$) are placed in cylinders 801 and 802, respectively. The flow rates of carrier gas and of hydrogenslenide are controlled by a pair of mass flow controllers 805, 806. The zinc adduct encapsulated in bubbler 807 is maintained at a predetermined temperature by a constant temperature bath 824. A desired amount of zinc adduct is introduced into reactor 814 by introducing and bubbling a proper amount of carrier gas into bubbler 807. Before being introduced into reactor 814, $H_2Se$ is mixed with the zinc adduct. This mixed gas causes the ZnSe thin film to grow on substrate 815 as shown in FIG. 4d. Valves 808, 809, 810, 811, 812, 813 control the rate of flow of gas throughout the MOCVD apparatus.

The temperature of substrate 815 is maintained at a value in the range from 300° to 400° C., the amount of bubbling occurring at a temperature of $-15°$ C. is from 10 to 40 SCCM, the flow rate of $H_2Se$ is from 4 to 20 SCCM, the total flow rate including carrier gas is from 4 to 6 SLM and the pressure of reaction gas is from 30 to 150 Torr. The covering ZnSe layer on the substrate has a length of 20 mm and a width of 30 mm but varies within $\pm 10$ percent of the average value.

Figure 3:
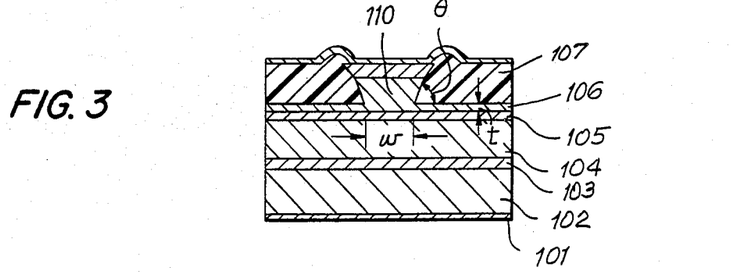
FIG. 3 is a cross-sectional view of a semi-conductor laser constructed in accordance with the invention.

The width w of the active layer and the thickness t of the cladding layer directly under the ZnSe layer are controlled to provide a fundamental transverse mode oscillation. Location of width (w) of the active layer and thickness (t) of the cladding layer in a semiconductor laser such as laser 100 in FIG. 1 are shown in FIG. 3. Table 1 shows threshold currents and the properties of the transverse mode in various combinations of w and t.

TABLE 1

| w (um) | t (um) | Threshold Current (mA) | Transverse Mode |
|---|---|---|---|
| 12 | 1 | 45 | high-order mode |
| 10 | 1 | 42 | fundamental mode |
| 10 | 0.7 | 42 | fundamental mode |
| 10 | 0.5 | 42 | fundamental mode |
| 5 | 2.1 | 31 | high-order mode |
| 5 | 1.0 | 30 | fundamental mode |
| 5 | 0.5 | 30 | fundamental mode |
| 5 | 0.2 | 30 | fundamental mode |
| 3 | 1.5 | 26 | fundamental mode |
| 3 | 1.0 | 26 | fundamental mode |
| 3 | 0.5 | 25 | fundamental mode |
| 3 | 0.2 | 27 | fundamental mode |
| 2 | 2.2 | 22 | high-order mode |
| 2 | 1.5 | 24 | fundamental mode |
| 2 | 0.5 | 22 | fundamental mode |
| 1 | 1.5 | 20 | fundamental mode |
| 1 | 1.0 | 21 | fundamental mode |
| 1 | 0.5 | 21 | fundamental mode |
| 0.5 | 1.0 | 20 | fundamental mode |
| 0.4 | | difficult to manufacture | |

As shown in Table 1, where the width of the base of the rib in the cladding layer is from 0.5 to 10.0 μm, a fundamental transverse mode oscillation can be achieved only when the thickness of the planar portion of the cladding layer is from 0 to 2.0 μm. When width (w) is over 10.0 μm and the thickness (t) is greater than 2.0 μm, a high order mode oscillation occurs and an oscillation wave of plural spots is omitted. Further, if width (w) is less than 0.5 μm, the semiconductor laser is very difficult to manufacture.

In order to insure that only a fundamental transverse mode oscillation at a low threshold current in a high output power with a small stigmatism occurs, an angle $\phi$ between side face 110a of rib 110 and the junction with plane 106 should be maintained within certain parameters. Table 2 shows properties of the transverse mode and values of threshold current, astigmatism and maximum output power for various values of $\phi$.

TABLE 2

| $\phi^{(0)}$ | Transverse Mode | Threshold Current (mA) | Astigmatic Distance (μm) | Maximum Output Power (mW) |
|---|---|---|---|---|
| 30 | fundamental mode | 80 | 5 | 3 |
| 40 | fundamental mode | 50 | 5 | 5 |
| 50 | fundamental mode | 38 | 5 | 15 |
| 60 | fundamental mode | 30 | 5 | 30 |
| 70 | fundamental mode | 25 | 4 | 40 |
| 80 | fundamental mode | 25 | 3 | 40 |
| 90 | fundamental mode | 25 | 3 | 37 |
| 100 | fundamental mode | 30 | 5 | 40 |
| 110 | fundamental mode | 40 | 6 | 40 |
| 120 | fundamental mode | 40 | 10 | 45 |
| 130 | high-order mode | 70 | 17 | 45 |
| 140 | high-order mode | 90 | 20 | 45 |

As shown in Table 2, when $\phi$ is less than 50°, the oscillation threshold is increased and the maximum output power is decreased. Furthermore, when $\phi$ is over 120°, high-order mode oscillation results in the oscillation wave is output as plural spots. Accordingly, $\phi$ is preferably maintained at values from about 50° to 120°, and the range between about 60° to 100° is most desirable.

Figure 9A:
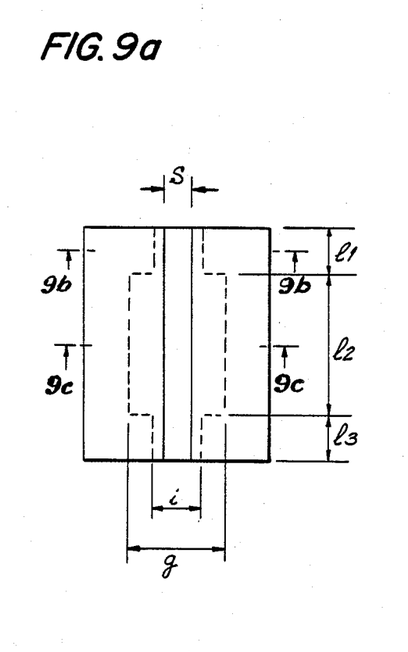
FIG. 9a is top plan view of a semiconductor laser constructed in accordance with an embodiment of the invention.
Figure 9B:
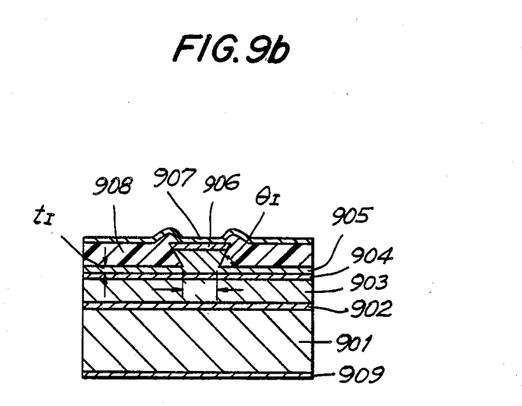
Figure 9C:
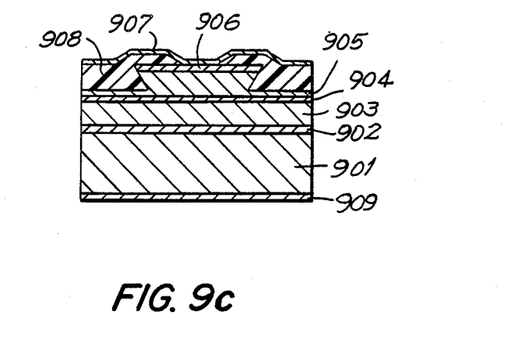

Other embodiments of semiconductor lasers constructed in accordance with the invention are shown in FIGS. 9a, 9b and 9c and the steps in the process of preparation are shown in FIG. 10.

Figure 10A:
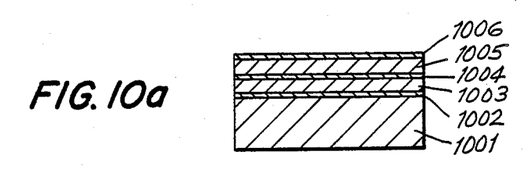
FIGS. 10a–10f are sectioned and plan views illustrating the steps in the process for preparing semiconductor lasers in accordance with an alternative embodiment of the invention.
Figure 10B:
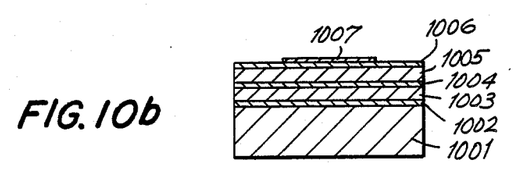
Figure 10C:
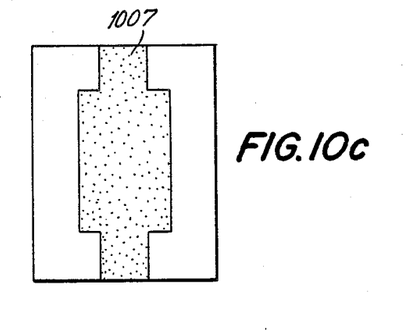
Figure 10D:
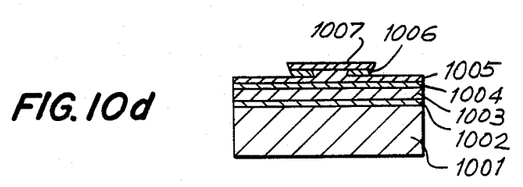

A laser 1000 formed as a double heterostructure is formed of layered semiconductor materials as follows. An N-type GaAs buffer layer 1002, a first N-type $Al_x Ga_{1-x}As$ cladding layer 1003, an $Al_y Ga_{1-y}As$ active layer 1004 (x>y), a second cladding layer of P-type $Al_z Ga_{1-z}As$ 1005 (z>y) and a P-type GaAs contact layer 1006 are formed on an N-type GaAs substrate 1001, successively (FIG. 10a). The LPE method, the MOCVD method or the MBE method is adaptable for forming each of the above films. Then, a resist mask 1007 is formed on contact layer 1006 for etching AlGaAs layer 1005 as shown in FIG. 10b and the shaded region of FIG. 10c. P-type GaAs contact layer 1006 and cladding layer 1005 of P-type $Al_z Ga_{1-z}As$ are then etched using resist mask 1007 as an etching mask. Next, resist mask 1007 shown in FIG. 10d is removed.

Figure 10E:
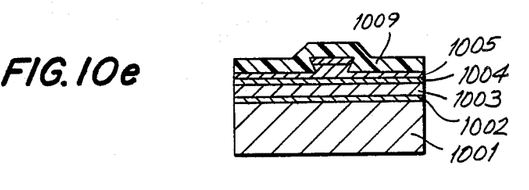
Figure 10F:
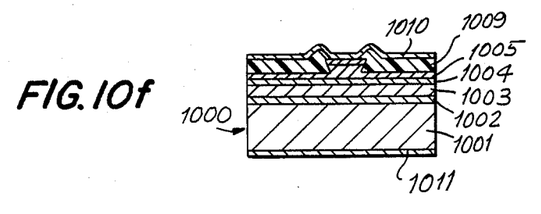
Figure 10G:
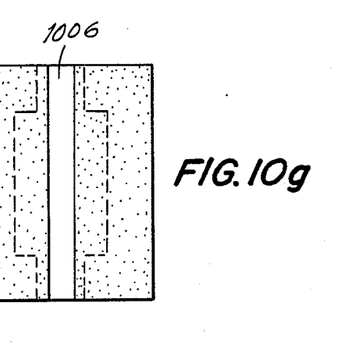

A ZnSe covering layer 1009 which is a group II-VI semiconductor is formed by he MOCVD method resulting in the structure shown in FIG. 10e. ZnSe is used only by way of example and other group II-VI semiconductors may be utilized. Covering ZnSe layer 1009 is shaped by etching and by a photolithographic process to expose the top surface of remaining contact layer 1006. The pattern of the upper surface of laser device 1000 after etching is shown in plan view FIG. 10g. The shaded portion corresponds to covering layer 1009 of the group II–VI semiconductor compound which acts to block leakage of the injection current. The stripe-shaped section in the center is the exposed section of P-type GaAs contact layer 1006, which acts as an electrode for restricting the current flow path. A P-type electrode 1010 is formed on contact layer 1006 and an N-type electrode 1011 is formed on the lower surface of substrate 1001. The back surface of substrate 1001 is polished to yield semiconductor laser 1000 in accordance with the invention.

A real refractive index wave guide is formed in accordance with the invention by the refractive index difference based on a real part of a complex refractive index along the parallel direction of the junction layer due to the non-absorption of light by the ZnSe layer. The thickness of the etched second cladding layer is an important parameter for setting the difference of the refractive index in the direction parallel to the junction. Because the refractive index of ZnSe is smaller than that of the covering ZnSe layer, when the ZnSe layer covers the rib and the ZnSe layer is smaller than the AlGaAs layer, the thickness of the remaining cladding layer necessary to obtain a single transverse made oscillation may be thicker than when the covering layer is made of AlGaAs.

In the index-guided structure, the width of the index-guided wave guide is as large as the width of the injection current near the end face of the cavity, so that a laser capable of a stable single transverse mode oscillation with a minimized astigmatic distance can be obtained. On the other hand, when the width of the index-guided wave guide is larger than that of the injection current in the center of the cavity, a gain-guided structure occurs with multi-access longitudinal oscillation allowing the greatest reduction of feedback induced noise.

Figure 11:
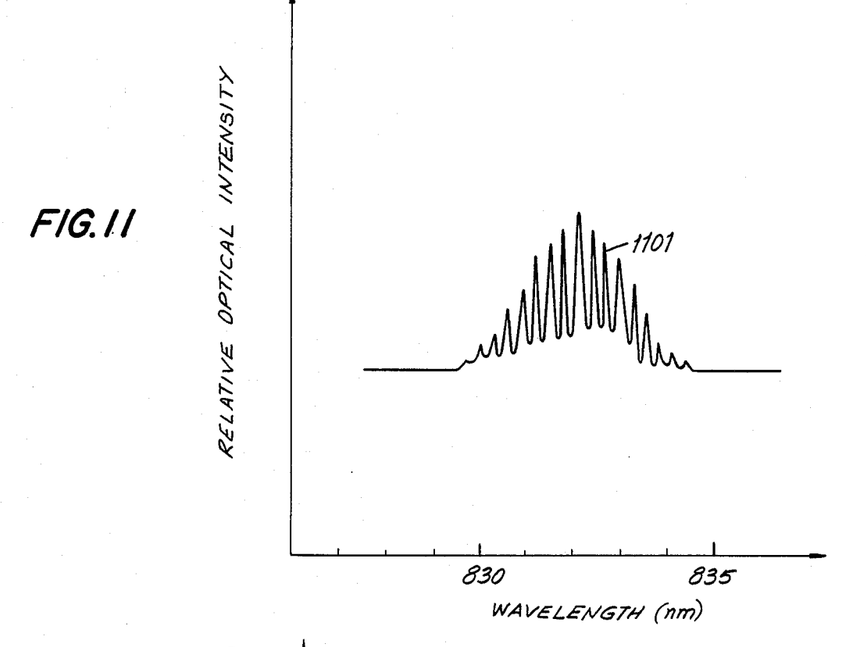
FIG. 11 is the oscillation spectrum of a semiconductor laser constructed in accordance with the invention.

FIG. 11 shows the longitudinal spectrum of emissions from a semiconductor laser constructed in accordance with the invention. The oscillation mode is multi oscillation.

Figure 12:
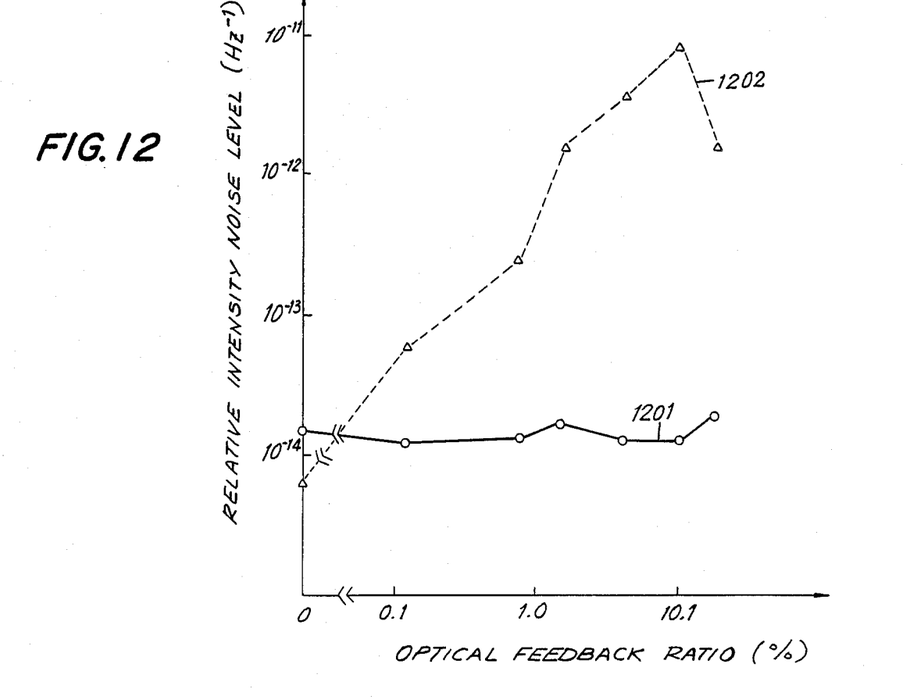
FIG. 12 is a graph showing the relationship between optical feedback ratio and degree of relative noise intensity in a prior art laser and in a laser constructed in accordance with the invention.
Figure 13:
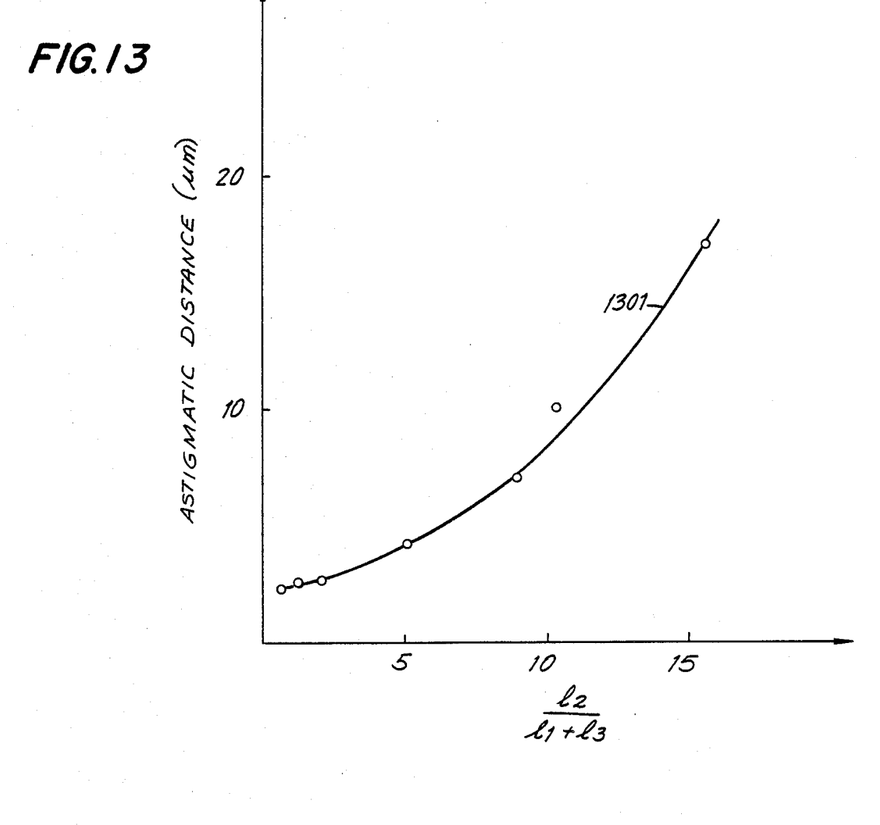
FIG. 13 is a graph illustrating the relationship between astigmatic distance and the value represented by the equation l2/(l1+l3) of a semiconductor laser constructed in accordance with the invention.

FIG. 12 is a graph illustrating the relationship between the relative intensity noise level and the optical feedback ratio. A curve 1201 shows the relationship for a semiconductor laser constructed in accordance with the invention achieving a multi-mode oscillation which is much lower than a curve 1202 which indicates the relationship for a prior art semiconductor laser in single mode oscillation. On the other hand, the width of the index-guided wave guide is as large as the width of the injection current near the end face of the cavity and forms an index guided structure. Thus, a transverse mode parallel to the junction is stablized and a far-field pattern like that in FIG. 6 can be obtained. Furthermore, the astigmatic distance is as short as that of the index-guided semiconductor laser, namely 3 $\mu$m or lower. However, the multi-longitudinal mode oscillation, the fundamental transverse mode oscillation, and low threshold current cannot be achieved unless the length of the index-guided wave region (l1 and l3) the length of the gain-guided region (l2), the width of the gain-guided region (g), the width of the index guided region (i) and the width of the injection current (s) are properly selected. The dimensions are illustrated in the plan view of FIG. 9a.

Table 3 shows the threshold current, the transverse mode and the longitudinal mode due to variations in the values of l1, l2, l3, g, i and s.

TABLE 3

| Sample No. | l1 ($\mu$m) | l2 ($\mu$m) | l3 ($\mu$m) | g ($\mu$m) | i ($\mu$m) | s ($\mu$m) | Threshold Current (mA) | Transverse Mode | Longitudinal Mode |
|---|---|---|---|---|---|---|---|---|---|
| 1 | 100 | 120 | 100 | 20 | 5 | 4 | 55 | fundamental | multi |
| 2 | 40 | 100 | 300 | 20 | 3 | 2 | 50 | fundamental | multi |
| 3 | 180 | 300 | 100 | 20 | 5 | 4 | 45 | fundamental | multi |
| 4 | 300 | 100 | 20 | 30 | 7 | 5 | 50 | fundamental | multi |
| 5 | 100 | 50 | 120 | 30 | 5 | 4 | 55 | fundamental | multi |
| 6 | 450 | 100 | 120 | 20 | 2 | 2 | 48 | fundamental | multi |
| 7 | 100 | 200 | 80 | 20 | 15 | 5 | 90 | fundamental | multi |
| 8 | 80 | 120 | 200 | 4 | 4 | 4 | 60 | fundamental | single |
| 9 | 100 | 150 | 150 | 15 | 5 | 4 | 65 | fundamental | multi |
| 10 | 200 | 120 | 100 | 15 | 5 | 15 | 120 | fundamental | multi |
| 11 | 5 | 200 | 80 | 20 | 5 | 4 | 55 | high-order | multi |
| 12 | 550 | 50 | 10 | 20 | 5 | 4 | 200 | fundamental | single |
| 13 | 200 | 5 | 70 | 20 | 5 | 4 | 45 | fundamental | single |
| 14 | 30 | 550 | 10 | 20 | 5 | 4 | 180 | fundamental | multi |

As shown in Table 3, when l1 or l3 is smaller than 10 $\mu$m, the transverse mode becomes a high-order and results in oscillation with plural spots. If l1 and l3 is over 500 $\mu$m, the longitudinal mode becomes a single-mode and the feedback induced noise cannot be reduced. Additionally, if l2 is 10 $\mu$m or lower, the longitudinal mode becomes a single-mode and the feedback-induced noise can not be reduced. When l2 is over 500 $\mu$m, the threshold current is at least 100 mA and when i is over 10 $\mu$m, the transverse mode becomes a high-order mode and forming a rib having a width i of 1 $\mu$m or less is not possible. A single longitudinal mode is generated when g is less than 5 $\mu$m and the threshold current is at least 100 mA when s is 10 $\mu$m or larger. Additionally, s should not be less than 1 $\mu$m for ease of manufacture.

As can be determined from these results, the following equations should be satisfied for providing a semiconductor laser with a multi-longitudinal mode, a fundamental transverse mode and low threshold current.

$$10 \ \mu m \leq l1 \leq 500 \ \mu m, \ l3 \leq 500 \ \mu m$$

$$10 \ \mu m \leq l2 \leq 500 \ \mu m$$

$$1 \ \mu m \leq i \leq 10 \ \mu m$$

$$5 \ \mu m \leq g$$

$$1 \ \mu m \leq s \leq 10 \ \mu m$$

More preferably, the following equations should be satisfied.

$20 \, \mu m \leq l_1 \leq 300 \, \mu m, \, l_3 \leq 300 \, \mu m$ $20 \, \mu m \leq l_2 \leq 350 \, \mu m$ $3 \, \mu m \leq i \leq 8 \, \mu m$ $10 \, \mu m \leq g$ $2 \, \mu m \leq s \leq 7 \, \mu m$ However, if $w_I$ and $t_I$ in FIG. 9b are not properly selected the astigmatism cannot be minimized.

TABLE 4

| Sample No. | $w_I$ ($\mu m$) | $t_I$ ($\mu m$) | Threshold Current (mA) | Transverse Mode | Astigmatism | Longitudinal Mode |
|---|---|---|---|---|---|---|
| 1 | 3 | 0.4 | 30 | fundamental | 2 | multi |
| 2 | 5 | 0.5 | 35 | fundamental | 3 | multi |
| 3 | 5 | 0.2 | 28 | fundamental | 2 | multi |
| 4 | 2 | 1 | 30 | fundamental | 2 | multi |
| 5 | 7 | 0.3 | 38 | fundamental | 4 | multi |
| 6 | 1 | 0.5 | 24 | fundamental | 3 | multi |
| 7 | 12 | 1 | 45 | high-order | 20 | multi |
| 8 | 5 | 2.5 | 40 | high-order | 18 | multi |
| 9 | 12 | 2.5 | 48 | high-order | 20 | multi |
| 10 | 0.4 | | difficult to manufacture | | | |

Table 4 shows threshold current, astigimatism and longitudinal mode for various values of $w_I$ and $t_I$ of the semiconductor laser constructed in accordance with the invention. When $w_I$ and $t_I$ are over 10 $\mu m$ and 2$\mu m$ respectively, a large astigmatic distance results. Furthermore, for ease of manufacture $w_I$ should be at least 0.5 $\mu m$.

Additionally, in the above construction, a high power output cannot be obtained if angle $\phi_I$ in FIG. 9b is not properly selected. The following Table 5 shows the threshold current, the property of a transverse mode, astigmatic distance and maximum output power for various values for $\phi_I$ of this semiconductor laser. The maximum output power is as high as 10 mW when $\phi$ is less than 50°, and a high order mode oscillation occurs when the angle is greater than 120°.

TABLE 5

| Sample No. | $\phi_I$(°) | Transverse Mode | Threshold Current | Astigmatic Distance | Maximum Output Power (mW) |
|---|---|---|---|---|---|
| 1 | 30 | fundamental | 80 | 4 | 8 |
| 2 | 40 | fundamental | 50 | 4 | 10 |
| 3 | 50 | fundamental | 40 | 3 | 15 |
| 4 | 60 | fundamental | 30 | 3 | 20 |
| 5 | 70 | fundamental | 25 | 3 | 35 |
| 6 | 80 | fundamental | 28 | 2 | 40 |
| 7 | 90 | fundamental | 25 | 3 | 35 |
| 8 | 100 | fundamental | 30 | 5 | 40 |
| 9 | 110 | fundamental | 35 | 7 | 40 |
| 10 | 120 | fundamental | 40 | 10 | 45 |
| 11 | 130 | high-order | 60 | 12 | 45 |
| 12 | 140 | high-order | 70 | 15 | 45 |

However, if the relationship between lengths $l_1$, $l_2$ and $l_3$ in FIG. 9a is not satisfied, elimination of noise and short astigmatic distance cannot be obtained.

Table 6 shows these values for some of the embodiments in accordance with the invention.

TABLE 6

| Sample No. | $l_1$ ($\mu m$) | $l_2$ ($\mu m$) | $l_3$ ($\mu m$) | $l_2/(l_1+l_3)$ | Longitudinal Mode | Astigmatic Distance |
|---|---|---|---|---|---|---|
| 1 | 100 | 100 | 100 | 0.50 | single | 2.5 |
| 2 | 100 | 110 | 100 | 0.55 | multi | 2.5 |
| 3 | 100 | 100 | 150 | 0.40 | single | 2.5 |
| 4 | 80 | 150 | 120 | 0.75 | multi | 3 |
| 5 | 150 | 50 | 120 | 0.19 | single | 2 |
| 6 | 170 | 100 | 130 | 0.33 | multi | 2 |
| 7 | 10 | 290 | 20 | 9.7 | multi | 7 |
| 8 | 8 | 300 | 20 | 10.7 | multi | 10 |
| 9 | 8 | 320 | 10 | 17.8 | multi | 17 |

As shown in Table 6, when the relationship indicated by the following equations is not satisfied, the longitudinal mode becomes a single mode and high feedback induced noise results.

$l_1 \neq l_2$ and $l_2 \neq l_3$ and $0.3 \leq l_2/(l_1+l_3)$

Furthermore, a more preferred relationship is indicated by the equation $l_1 \neq l_3$. In this case, stable multi-mode oscillation having desirable duplicability can be obtained and the feedback induced noise can be reduced. When the following equations are satisfied, $l_1+l_2 \neq l_3$ or $l_2+l_3 \neq l_1$, oscillation in the internal cavity structure is emphasized and stable multi-mode oscillation can be obtained with favorable reproductivity. In addition the feedback induced noise can be reduced.

Furthermore, when the equation $l_2/(l_1+l_3) \leq 10$ is not satisfied, the astigmatic distance is at least 8 $\mu m$. An optical system for a condenser within 1 $\mu m$ is complicated and is not suitable for practical use. Therefore, in order to obtain a semiconductor laser achieving reduced feedback induced noise and short astigmatic distance, the following should be satisfied:

$l_1 \neq l_2$ and $l_2 \neq l_3$ $0.3 \leq l_2/(l_1+l_3) \leq 10$

By providing a double heterostructure semiconductor laser having a cladding layer and contact layer of a Group III-V semiconductor etched and buried by a layer of Group II-VI semiconductors many advantages over the prior art are presented.

1. Current leaks to the outside of the oscillating region are avoided allowing desirable oscillation with a low threshold current due to the ultra high resistivity of the Group II-VI semiconductor covering the Group III-V semiconductor layer. Accordingly, heat generation from the semiconductor laser may also be reduced and this facilitates manufacturing the device especially mounting a heat sink. At the same time, the invention is adaptable to the fundamental structure of an integrated laser or optoelectronic integrated circuit (OEIC).

2. The Group II–VI semiconductor cover or confinement layer has a lower refractive index than that of the Group III–V semiconductor in the oscillation region. Thus, a guided structure due to the real part of the complex refractive index can be obtained. Proper selection of (w) and (t) provides a stable fundamental transverse mode oscillation and a proper selection of φ makes it possible to obtain low astigmatism and high maximum output power.

3. The Group II–VI semiconductor confinement layer does not form interfaces on either side of the rib, further regrowth does not occur in the current flow path so that there are no interface states induced by regrowth. Accordingly, deterioration is avoided regardless of operation length, resulting in a semiconductor laser of high reliability.

4. Since the Group II–VI semiconductor confinement layers is formed by the MOCVD process using a zinc adduct as a source material, a confinement layer having a good crytalline quality can be formed at a low temperature. Hence an injection blocking layer with high resistivity can be easily formed on double heterostructures such as the oscillation portion. Furthermore, a layer of uniform thickness over a large area can be formed by the MOCVD method using a metalorganic adduct, resulting in a high yield rate of semiconductor lasers having uniform properties.

5. Since all of the semiconductor layers can be made by the MOCVD method, prior art proceses of low productivity such as zinc diffusion or ion implanation may be avoided. Accordingly, a semiconductor layer having uniform properties over a large area can be formed and mass production and low cost can be achieved.

6. Since the guided structure is formed by a gain-guided structure in the center of the cavity, a multi-longitudinal mode oscillation is achieved. Hence a semiconductor laser with extremely low feedback induced noise can be manufactured.

7. Lengths $l_1$, $l_2$, $l_3$, g, i and s may be limited to obtain a semiconductor laser capable of a stable multi-longitudinal mode oscillation and of a stable fundamental transverse mode oscillation with low feedback induced noise and low threshold current.

8. By further limiting the lengths of $w_I$ and $t_I$ a noiseless semiconductor laser with low astigmatism and capable of a fundamental transverse mode oscillation can be manufactured.

9. Similar results are achieved by limiting the angle φ and high maximum output power as well.

10. A noiseless semiconductor laser with low astigmatism can be easily mass produced due to the proportional lengths of 11, 12, and 13.

It will thus be seen that the objects set forth above, among those made apparent from the preceding description, are efficiently obtained and since certain changes may be made in the above construction and process without departing from the spirit and scope of the invention, it is intended that all matter contained in the above description and shown in the accompanying drawings shall be interpreted and illustrative and not in the limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor laser, comprising:
   an active layer;
   a cladding layer on the active layer;
   a contact layer on the cladding layer;
   a second electrode formed below the active layer;
   a first electrode formed above the contact layer;
   the active layer, cladding layer and contact layer each formed of semiconductors of elements from Groups III–V;
   the contact layer and cladding layer formed into an elongated projecting rib, with the cladding layer including a remaining planar portion disposed on the active layer, the rib containing a cavity formed along the widthof the rib along a portion of its length; and
   a high resistance film of a semiconductor of elements from Groups II–VI disposed on each side of the rib supported on the remaining cladding layer planar portion.

2. The semiconductor laser of claim 1, wherein the width of the base of the rib above the active layer is between 0.5 and 10.0 μm and the thickness of the remaining cladding layer planar portion on the active layer between the active layer and the high resistance film is between 0 and 2.0 μm.

3. The semiconductor laser of claim 1, wherein the junction between a side face of the projecting rib and the remaining cladding layer planar portion is an angle between 50° and 120°.

4. The semiconductor laser of claim 1, wherein the rib has an inverted trapezoidal shape with side faces inclining upwardly towards the base of the trapezoid.

5. The semiconductor laser of claim 1, wherein said active layer is flat, the width of the rib is dimensioned so that a wave guide formed by the high resistance film forms an index-guided structure near an end face of the cavity and wide enough to form a gain-guided structure in the center of the cavity.

6. The semiconductor laser of claim 5, further comprising a striped electrode for controlling the current flow path disposed on the upper portion of the wave guide.

7. The semiconductor laser of claim 5, wherein the length of the region of the index-guided structure is between 10 and 500 μm on the light output side, the length of the gain-guided region is between 10 and 500 μm, the width of the index guided region is between 1 and 10 μm, the width of the gain-guided structure is at least 5 μm and the width of the stripe which controls the current flow path is between 1 and 10 μm.

8. The semiconductor laser of claim 5, wherein the width of the rib in the index-guided region is between 0.5 and 10 μm and the thickness of the remaining cladding layer planar portion on the active layer between the active layer and the high resistance film is between 0 and 2.0 μm.

9. The semiconductor laser of claim 5, wherein the angle between the side face of the rib in the ndex-guided region and the remaining cladding layer planar portion is between 50° and 120°.

10. The semiconductor laser of claim 5, wherein the relationship between the length of the index-guided region and the length of the gain-guided region is represented by the following equations:

$$l_2 \neq l_3, l_1 \neq l_2$$

$$0.3 \leq l_2/(l_1+l_3) \leq 10$$

wherein $l_1$ and $l_3$ are the length of the index guided region and $l_2$ is the length of the gain-guided region.

11. The semiconductor laser of claim 1, wherein the high resistance film is made of ZnSe, the cladding layer is made of AlGaAs and the active layer is flat and made of either GaAs or AlGaAs.

12. The semiconductor laser of claim 2, wherein the active layer is flat, the angle between a side face of the rib and the junction with the remaining cladding layer planar portion is between 50° and 120°.

13. The semiconductor laser of claim 2, wherein the active layer is flat, the width of the rib is dimensioned so that a wave guide formed by the high resistance film forms an index-guided structure near an end face of a cavity formed by the laser and wide enough to form a gain-guided structure in the center of the cavity.

14. The semiconductor laser of claim 3, wherein the active layer is flat, the width of the rib is dimensioned so that a wave guide formed by the insulating layer forms an index-guided structure near an end face of a cavity formed by the laser and wide enough to form a gain-guided structure in the center of the cavity.

15. The semiconductor laser of claim 12 wherein the active layer is flat, the width of the rib is dimensioned so that a wave guide formed by the high resistance film forms an index guided structure near an end surface of the cavity and wide enough to form a gain-guided structure in the center of the cavity, wherein the relationship between the length of the gain-guided region and the length of the index guided region is represented by the following equations:

$$l_2 \neq l_3, l_1 \neq l_2$$

$$0.3 \leq l_2/(l_1+l_3) \leq 10$$

wherein $l_1$ and $l_3$ are the length of the index guided region and $l_2$ is the length of the gain-guided region.

16. The semiconductor laser of claim 13, wherein the relationship between the length of the index-guided region and the length of the gain-guided region is represented by the following equations:

$$l_2 \neq l_3, l_1 \neq l_2$$

$$0.3 \leq l_2/(l_1+l_3) \leq 10$$

wherein $l_1$ and $l_3$ are the length of the index guided region $l_2$ is the length of the gain-guided region.

17. The semiconductor laser of claim 14, wherein the relationship between the length of the index-guided region and the length of the gain-guided region is represented by the following equations:

$$l_2 \neq l_3, l_1 \neq l_2$$

$$0.3 \leq l_2/(l_1+l_3) \leq 10$$

wherein $l_1$ and $l_3$ are the length of the index guided region and $l_2$ is the length of the gain-guided region.

18. The semiconductor laser of claim 17, wherein the high resistance film in ZnSe, the cladding layer is AlGaAs and the active layer is either GaAs or AlGaAs.

19. The semiconductor laser of claim 1, further including a lower cladding layer, the active layer being disposed on the lower cladding layer.

20. The semiconductor laser of claim 19, wherein the width of the base of the rib above the active layer is between 0.5 and 10.0 μm and the thickness of the remaining cladding layer planar portion on the active layer between the active layer and high resistance film is between 0 and 2.0 μm.

21. The semiconductor laser of claim 19, wherein the junction between a side face of the projecting rib and the remaining cladding layer planar portion is an angle between 50° and 120°.

22. The semiconductor laser of claim 19, wherein the active layer is flat and further including a cavity formed along the width of the rib along a portion of its length, the width of the rib is dimensioned so that a wave guide formed by the high resistance layer forms an index-guided structure near an end face of the cavity and wide enough to form a gain-guided structure in the center of the cavity.

23. The semiconductor laser of claim 22, wherein the relationship between the length of the index guided region and the length of the gain-guided region is represented by the following equations:

$$l_2 \neq l_3, l_1 \neq l_2$$

$$0.3 \leq l_2/(l_1+l_3) \leq 10$$

wherein $l_1$ and $l_3$ are the length of the index guided region and $l_2$ is the length of the gain-guided region.

24. A double heterostructure semiconductor laser, comprising:
a substrate;
a first cladding layer on the substrate;
an active layer on the first cladding layer;
a second cladding layer on the active layer;
a contact layer on the second cladding layer;
a first electrode formed above the contact layer;
a second electrode formed belwo the substrate
the active layer, cladding layers and contact layer each formed of semiconductors of elements from Groups III–V;
the contact layer and second cladding layer formed into an elongated projecting rib, with the cladding layer including a remaining planar portion disposed across the active layer, the rib containing a cavity formed along the width of the rib along a portion of its length; and
a high resistance film of a semiconductor element from Groups II–VI disposed on each side of the rib supported on the remaining cladding layer planar portion.

25. The semicondutor laser of claim 11, wherein the zinc source of the high resistance film is formed by metal organic chemical vapor deposition using a zinc organic as the zinc source.

26. The semiconductor laser of claim 25, wherein the zinc organic is an adduct of dyalchozinc and dyalchosulenium.

* * * * *